United States Patent [19]

Hoshino et al.

[11] Patent Number: 5,289,135

[45] Date of Patent: * Feb. 22, 1994

[54] PULSE PHASE DIFFERENCE ENCODING CIRCUIT

[75] Inventors: Kouichi Hoshino, Ohbu; Takamoto Watanabe, Nagoya; Yoshinori Ohtsuka, Okazaki, all of Japan

[73] Assignees: Nippon Soken, Inc., Nishio; Nippondenso Co., Ltd., Kariya, both of Japan

[*] Notice: The portion of the term of this patent subsequent to Jul. 7, 2009 has been disclaimed.

[21] Appl. No.: 909,211

[22] Filed: Jul. 6, 1992

Related U.S. Application Data

[63] Continuation of Ser. No. 645,874, Jan. 25, 1991, Pat. No. 5,128,624.

[30] Foreign Application Priority Data

Jan. 25, 1990 [JP] Japan .................. 2-15865

[51] Int. Cl.⁵ ............................. G01R 25/08
[52] U.S. Cl. ..................... 328/133; 377/43; 328/55
[58] Field of Search ............. 377/44, 46, 54, 55, 377/111, 75, 76, 72; 328/133, 55; 307/517; 324/83

[56] References Cited

U.S. PATENT DOCUMENTS

| | | | |
|---|---|---|---|
| 2,953,694 | 9/1960 | Wilson | 377/76 |
| 3,578,956 | 5/1971 | McCall | 377/43 |
| 3,735,270 | 5/1973 | Holub | 328/55 |
| 3,992,635 | 11/1976 | Suzuki et al. | 377/72 |
| 4,086,471 | 4/1978 | Takahashi | 377/44 |
| 4,206,414 | 6/1980 | Chapman | 328/133 |
| 4,216,544 | 8/1980 | Boleda | 328/133 |
| 4,316,158 | 2/1982 | Akita | 331/111 |
| 4,319,188 | 3/1982 | Ito et al. | 324/173 |
| 4,649,342 | 3/1987 | Nakamura | 324/252 |
| 4,712,904 | 1/1988 | Ozaki et al. | 324/83 R |
| 4,754,221 | 6/1988 | Ao et al. | 324/252 |
| 5,005,064 | 4/1991 | Yoshino et al. | 257/421 |
| 5,027,373 | 6/1991 | Cok | 328/133 |
| 5,049,766 | 9/1991 | van Driest et al. | 328/133 |
| 5,087,842 | 2/1992 | Pulsipher et al. | 328/55 |
| 5,128,624 | 7/1992 | Hoshino et al. | 328/133 |

FOREIGN PATENT DOCUMENTS

| | | |
|---|---|---|
| 0142336 | 9/1982 | Japan . |
| 0061583 | 4/1983 | Japan . |
| 0037611 | 9/1984 | Japan . |
| 0104925 | 6/1985 | Japan . |
| 0173434 | 9/1985 | Japan . |
| 0138457 | 10/1989 | Japan . |

OTHER PUBLICATIONS

Sensor Device Hand Book (Feb. 25, 1985) pp. 54-59 (Japan) (with translation).

*Primary Examiner*—John S. Heyman
*Attorney, Agent, or Firm*—Cushman, Darby & Cushman

[57] ABSTRACT

A pulse phase difference encoding circuit provides a digital signal indicating a phase difference between a first input pulse and a second input pulse. The first input pulse is provided to and circulated in a ring signal delay circuit having a plurality of signal delay elements that are connected in series. Intermediate points between the delay elements provide delayed pulses having different delay times. Upon receiving the second input pulse, a selector selects one delay pulse provided by the delay element at which the first input pulse has arrived, and generates a digital positional signal indicating a position of the selected delay element. The number of rounds of circulation of the first input pulse in the ring signal delay circuit is separately counted. According to the number of rounds of circulation of the first pulse and the positional signal, the digital signal indicating the phase difference between the first and second input pulses is formed.

14 Claims, 8 Drawing Sheets

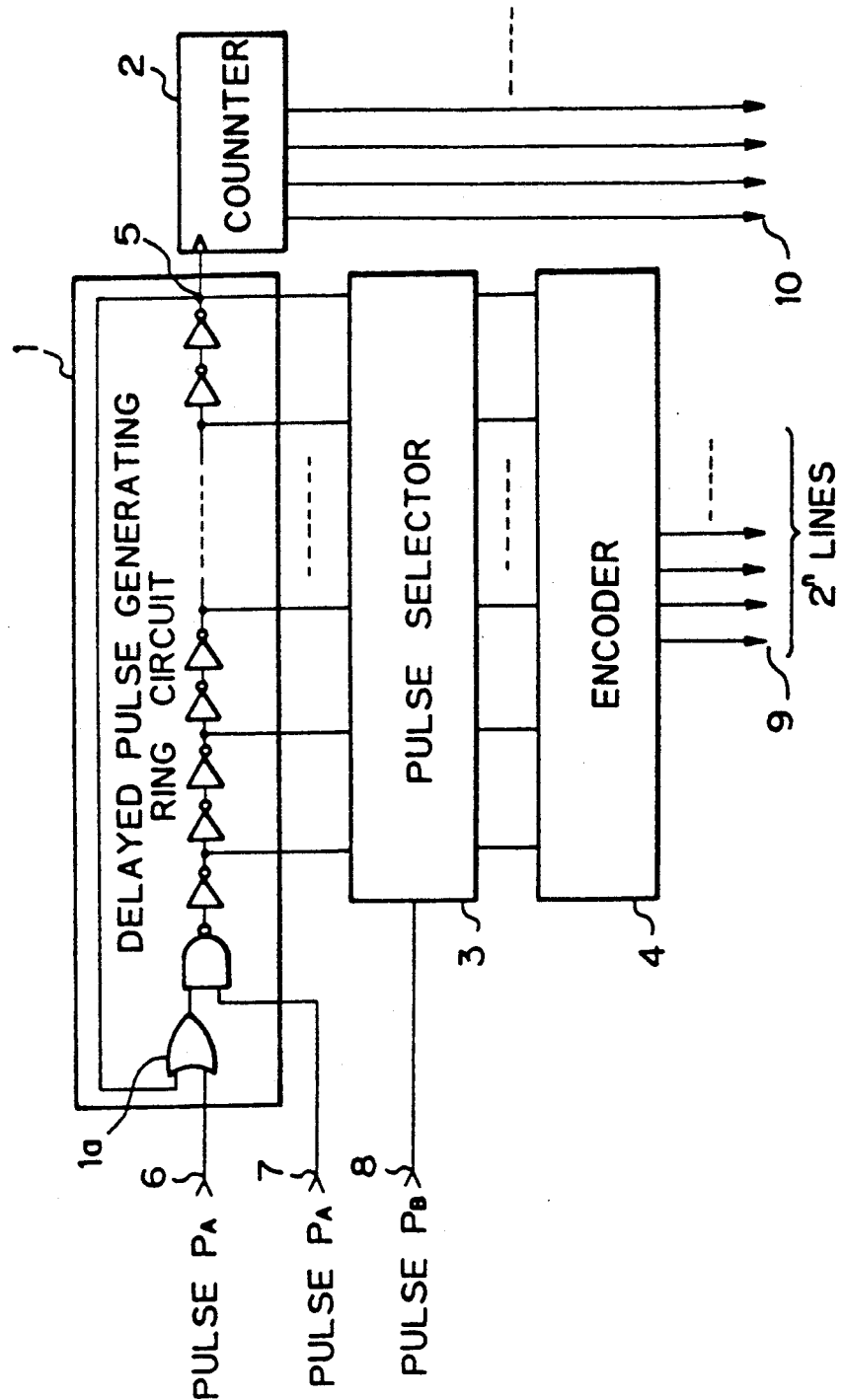

PULSE PHASE DIFFERENCE ENCODING CIRCUIT

This is a continuation of U.S. Ser. No. 07/645,874, filed Jan. 25, 1991, now U.S. Pat. No. 5,128,624.

BACKGROUND OF THE INVENTION

1. Field of the Invention

The present invention relates to a circuit for detecting a phase difference between two pulse signals having optional phases, and particularly to a pulse phase difference encoding circuit that can accurately detect the phase difference over a wide range.

2. Description of the Related Art

A prior art technique encodes a phase difference between two pulses PA and PB into a digital signal composed of a plurality of bits that represent a positive or negative shift (difference) between phases of the two pulses PA and PB. The detection range of the phase shift of this technique can be expanded without deteriorating the detection accuracy by increasing the number of bits of the digital signal.

The increase in the number of bits, however, increases circuit scale. If the circuit scale must be kept as it is, the detection range is expandable only by sacrificing the detection accuracy.

When phases of two pulses PA and PB change in response to a change in a physical quantity, it is possible to find the change in the physical quantity by detecting a difference between the phases. Based on this idea, a sensor can be made. This sort of sensor must have a wide detection range and high detection accuracy to respond to sensing elements that cause large phase changes or have a variety of characteristics to cause a large phase difference. Further, for the sake of compactness and economy, the size of the sensor must not be increased excessively.

SUMMARY OF THE INVENTION

An object of the present invention is to provide a pulse phase difference encoding circuit for encoding and detecting a phase difference between two pulses, having a wide detection range, compact circuit scale, and high detection accuracy.

In order to accomplish the object, the present invention provides a pulse phase difference encoding circuit comprising a delayed pulse generating ring circuit (1) composed of many signal delay circuits that are connected to one another in a ring shape. A first pulse PA is provided at optional timing to the signal delay circuits and is circulated in the signal delay circuits. The signal delay circuits repeatedly provide a plurality of delayed pulses when the first pulse PA passes through the respective signal delay circuits. The delayed pulses sequentially follow one after another with a delay time of each signal delay circuit.

A counter (2, 21, 22) counts the number of rounds of circulation of the first pulse PA in the delayed pulse generating ring circuit (1).

A pulse selector (3) has a plurality of input lines for receiving the delayed pulses from the delayed pulse generating ring circuit (1), and a plurality of output lines respectively corresponding to the delayed pulses. When a second pulse PB forming an optional phase difference relative to the first pulse PA is provided to the pulse selector (3), the pulse selector selects one delayed pulse that has a special temporal relationship with the second pulse PB out of the delayed pulses provided by the delayed pulse generating ring circuit (1), and changes the voltage of one output line corresponding to the selected delayed pulse.

An encoder (4) receives output signals from the output lines of the pulse selector (3), and provides a binary digital signal indicating the one delayed pulse selected by the pulse selector (3).

The number of rounds of circulation of the first pulse PA in the delayed pulse generating ring circuit at the time when the second pulse PB is provided forms upper bits, and the binary digital signal provided by the encoder (4) forms lower bits. The upper and lower bits form a digital signal indicating a phase difference between the first and second pulses PA and PB.

According to the present invention, the first pulse PA is circulated in the signal delay circuits that are connected to one another in a ring shape. Even if the number of the signal delay circuits is small, i.e., even with a small circuit scale, the counter (2) counts the number of rounds of circulation of the first pulse PA in the signal delay circuits, and the counted number of rounds forms upper bits of a digital signal having a high resolution for indicating a phase difference.

BRIEF DESCRIPTION OF THE DRAWINGS

FIG. 1 is a view schematically showing an embodiment of the present invention;

DESCRIPTION OF THE PREFERRED EMBODIMENTS

Figure 2A:
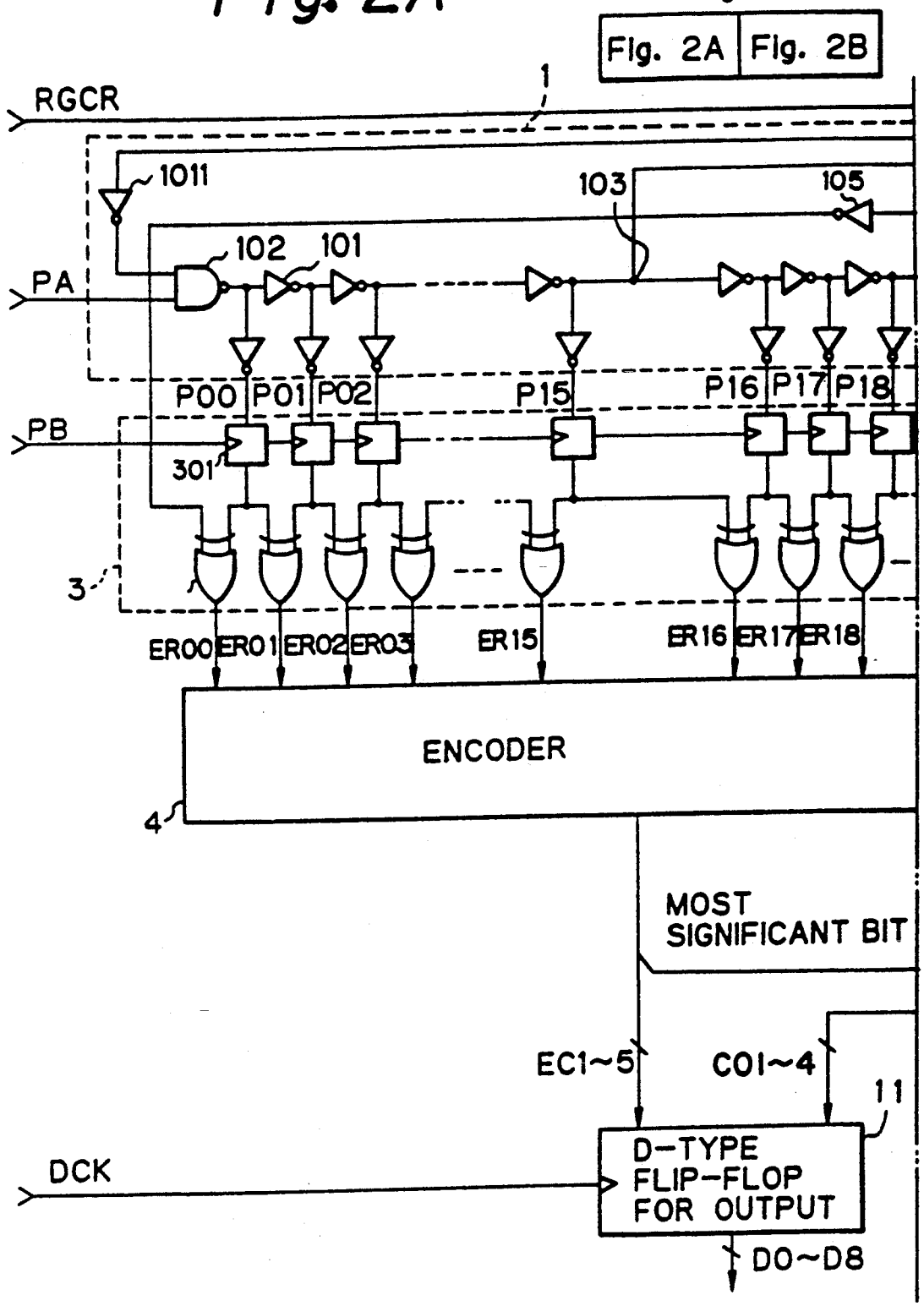
FIGS. 2A and 2B are circuit diagrams showing a first embodiment of the present invention.

Firstly, an outline of the present invention will be explained with reference to the drawings.

FIG. 1 schematically shows an arrangement of a pulse phase difference encoding circuit according to the present invention. The circuit comprises a delayed pulse generating ring circuit 1 having many signal delay circuits (sometimes referred to as gate delays), a counter 2, a pulse selector 3, and an encoder 4. A terminal 6 receives a first input pulse PA. The delayed pulse generating ring circuit 1 provides a plurality of delayed pulses. A delay time of any one of the delayed pulses is determined by the number of the signal delay circuits (gate delays) passed by the first pulse PA to generate the one delayed pulse.

The pulse selector 3 receives the delayed pulses, as well as a second pulse PB through a terminal 8. The second pulse PB is delayed behind the first pulse PA. Upon receiving the second pulse PB, the pulse selector 3 selects one input corresponding to one delayed pulse just triggered by the first pulse PA in the delayed pulse generating ring circuit 1, and provides the encoder 4 with a signal indicating the selected input. The encoder 4 then generates a binary digital signal indicating the selected input.

An end point 5 of the delayed pulse generating ring circuit 1 is connected to an OR circuit 1a, thereby connecting the signal delay circuits to one another in a ring shape. With a cumulative delay time of all the signal delay circuits, the first pulse PA again appears at the start (a left end in FIG. 1) of the delayed pulse generating ring circuit 1.

A clock terminal of the counter 2 receives an output from the end point 5, and the counter 2 divides a frequency of the received output and produces an output indicating the number of rounds of circulation of the first signal PA. Namely, an output 10 of the counter 2 provides upper bits for an output 9 of the encoder 4.

To continuously carry binary numbers of the output 9 of the encoder 4 to binary numbers of the output 10 of the counter 2, the encoder 4 must have $2^n$ output lines for the output 9. The delayed pulse generating ring circuit 1 is reset by zeroing an input 7 of a NAND gate.

The delayed pulse generating ring circuit 1 and pulse selector 3 correspond to a delayed pulse generating circuit and a synchronous pulse detecting circuit disclosed in "Magnetic Detection Device and Physical Quantity Detection Device Using Sane" of U.S. patent application Ser. No. 07/467,402.

Unlike the disclosure of this U.S. patent application, the end point 5 of the delayed pulse generating ring circuit 1 of the present invention is connected to the start of the same circuit 1 to repeatedly use the signal delay circuits of the ring circuit 1. This is the reason why the present invention can expand a detection range without considerably increasing a circuit scale. By increasing the number of frequency divisions of the counter 2, it is possible to further expand the detection range. The expansion of the detection range may not deteriorate the detection accuracy of the circuit because the accuracy is determined only by the delay time of each signal delay circuit of the delayed pulse generating ring circuit.

The present invention expresses a phase difference between two pulses as a binary digital signal. A time resolution of the binary digital signal is determined by a delay time of each delay stage of the delayed pulse generating ring circuit 1. By shortening the delay time of each delay stage, a phase difference detection resolution may remarkably improve. For example, if each delay stage comprises an inverter which determines the delay time, the detection resolution of phase difference will be less than several nanoseconds.

A resolution in encoding a pulse phase difference is inversely proportional to the encoding range. For example, if the resolution improves two times, the encoding range decreases by half. According to the pulse phase difference encoding circuit of the present invention, however, an output of the counter 2 forms upper bits of an encoded phase difference, so that the encoding range may be expanded by increasing the number of bits of the counter output, without increasing to circuit scale.

The pulse phase difference encoding circuit of the present invention will be explained next in more detail.

According to the present invention, the pulse phase difference encoding circuit for producing a digital signal that indicates a time difference between a first pulse and a second pulse, comprises:

delayed pulse generating means having a plurality of delay elements connected in series to form a series circuit, one end of the series circuit receiving the first pulse, the means generating a plurality of delayed pulses while the first pulse is passing through the delay elements;

positional signal generating means for selecting the latest one of the delayed pulses upon receiving the second pulse that occurs after the first pulse, and generating a positional signal indicating a position of the selected delayed pulse among the other not-selected delayed pulses;

output means for receiving the positional signal and producing a digital signal indicating the time period between a time of input of the first pulse and a time of input of the second pulse;

means for connecting the one end of the series circuit to the other end thereof to repeatedly circulate the first pulse from the one end toward the other end through the delay elements of the series circuit;

counting means for counting the number of rounds of circulation of the first pulse in the series circuit; and means for supplementing the digital signal provided by the output means with the number of rounds of circulation counted by the counting means, thereby having the digital signal represent the phase difference between the first and second pulses.

Figure 2B:
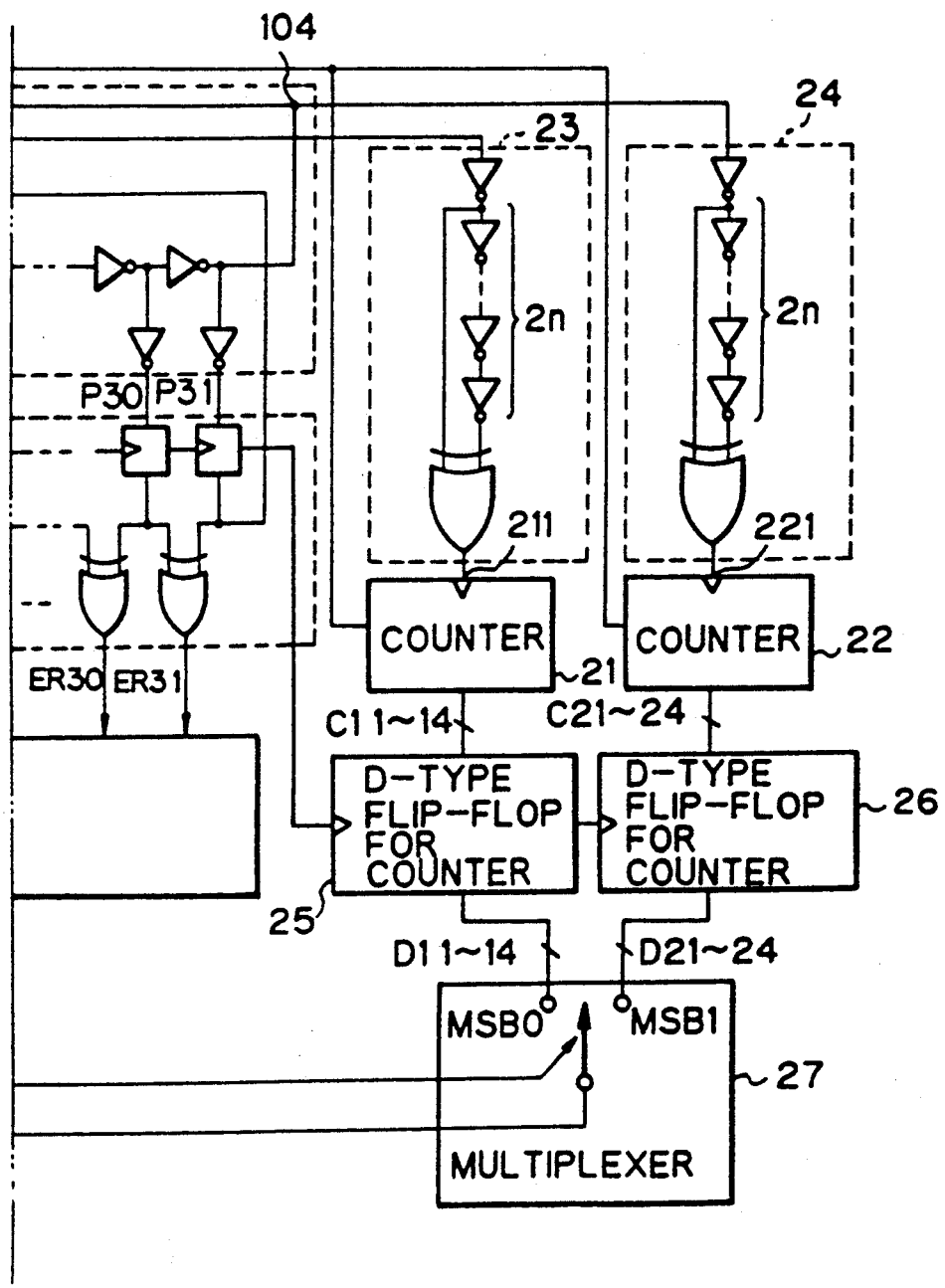
Figure 3:
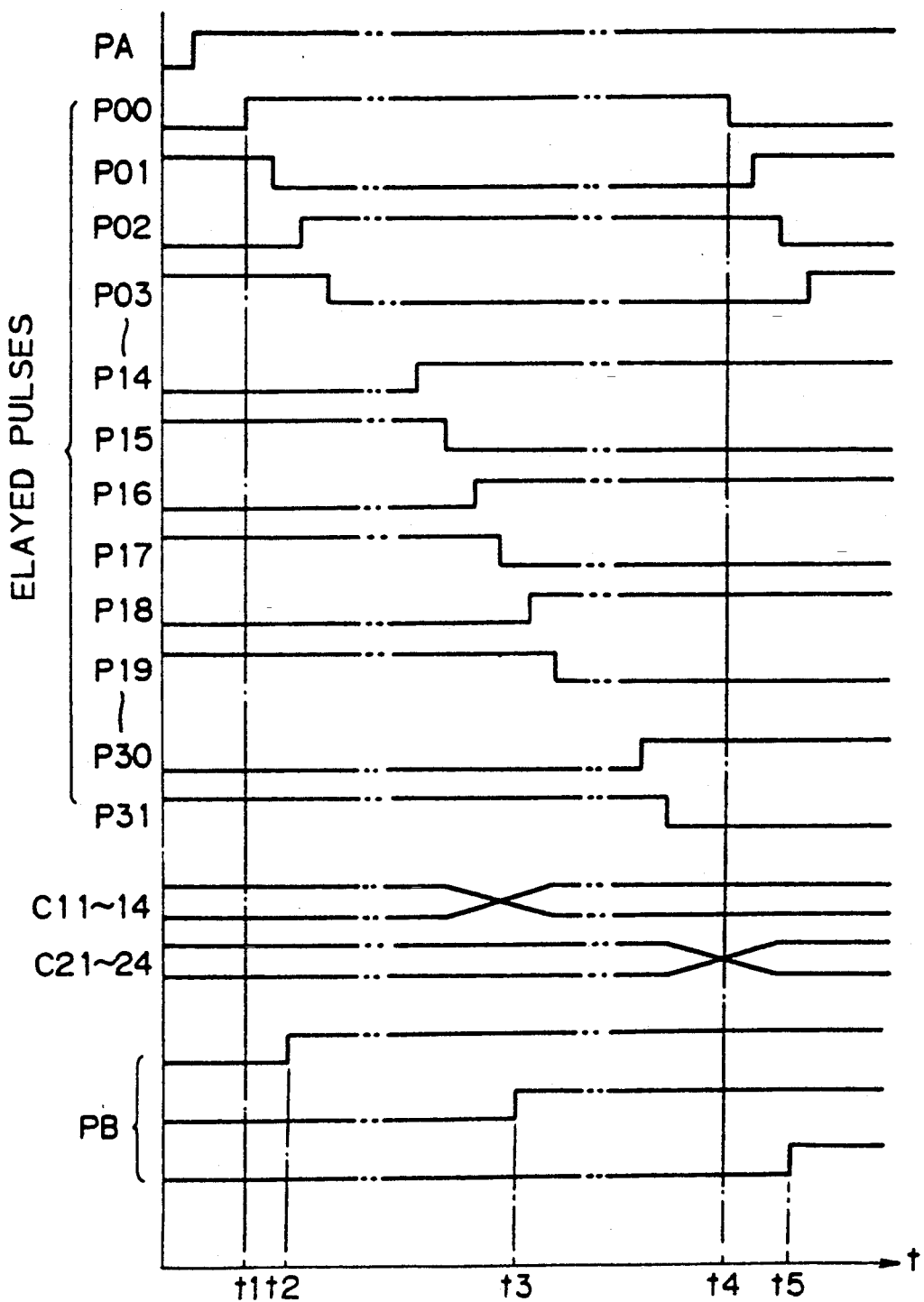
FIG. 3 is a view showing waveforms appearing at various parts of the circuit of FIG. 2.

FIGS. 2A and 2B shows a pulse phase difference encoding circuit according to the first embodiment of the present invention. The circuit receives a first pulse PA and then a second pulse PB, and encodes a difference between rise times of the two pulses into a binary digital signal. FIG. 3 is a timing chart of signals produced in the circuit. The circuit will be explained with reference to FIGS. 2A, 2B and 3.

FIGS. 2A and 2B, a delayed pulse generating ring circuit 1 repeatedly generates delayed pulses P00 to P31 each having a delay time corresponding to the number of inverters 101 through which the first pulse PA has passed to generate the delayed pulse in question. A delay time of each delay stage (inverter) determines a phase difference detection resolution. By shortening the delay time of each delay stage, the detection resolution improves. In the embodiment, the delay time is equal to the delay time of each inverter 101.

In FIG. 3, the delayed pulses P00 to P31 are inverted relative to one another (for example, the delayed pulse P01 is inverted relative to the preceding delayed pulse P00), and delayed behind one preceding delayed pulse by the delay time produced by one inverter.

In this embodiment, the number of the inverters of the delayed pulse generating ring circuit 1 is odd, and an inverter 1011 and a NAND gate 102 are interposed between the delayed pulses P31 and P00 to produce a delay time corresponding to two inverters.

When a rise of the first pulse PA is supplied to the delayed pulse generating ring circuit 1, the delayed pulse P00 rises after a delay time of the NAND gate 102. Thereafter, the delayed pulse P01 falls after a delay time determined by the NAND 102 and one inverter 101. Then, the delayed pulses P02 to P31 sequentially and alternately rise and fall. After the delayed pulse P31, the second delayed pulses P00 to P31 occur.

Since there are an odd number of the inverters in one round of the ring delay pulse generating circuit 1, the second delayed pulses P00 to P31 are inverted relative to the first delayed pulses P00 to P31 and provided with an additional delay time corresponding to one round of the ring delay pulse generating circuit 1.

For example, in FIG. 3, the delayed pulse P00 rises at time t1 in the first round and falls at time t4 in the second round. In this way, the delayed pulses P00 to P31 alternatively rise and fall in every round of the delayed pulse generating ring circuit 1.

FIGS. 2A and 2B, a pulse selector 3 has D-type flip-flops (Dffs) 301 for receiving the delayed pulses P00 to P31 respectively from the delayed pulse generating ring circuit 1. The D-type flip-flops 301 use the second pulse PB as a clock pulse. When the second pulse PB rises, the D-type flip-flops 301 select one of the delayed pulses just triggered by the first pulse PA, as well as one of pulse selector outputs ER0 to ER31 corresponding to the selected delayed pulse.

For example, in FIG. 3, the second pulse PB rises at time t2, and one delayed pulse just caused by the first pulse PA is selected. As a result, outputs of the D-type flip-flops 301 corresponding to the delayed pulses P01 and P02 are simultaneously zeroed. The delayed pulses P01 and P02 are provided to inputs of corresponding EXORs (exclusive OR circuits) 302 to zero only the output ER02 of the pulse selector 3.

There are an even number of delayed pulses P00 to P31 in the embodiment of FIG. 2. This is why an inverter 105 is inserted. If this inverter 105 is not provided, there is a danger of zeroing the output ER00 of the pulse selector 3 not only when the first pulse PA produces the delayed pulse P31, but also on other occasions.

FIGS. 2A and 2B, a known encoder 4 receives the 32 outputs ER00 to ER31 of the pulse selector 3. When one of the 32 outputs ER00 to ER31 becomes zero, the encoder 4 provides a binary digital signal comprising five digits EC1 to EC5 indicating the zeroed output of the pulse selector 3.

For example, in FIG. 3, the second pulse PB rises at time t3, and the D-type flip-flops 301 corresponding to the delayed pulses P17 and P18 are zeroed. As a result, among the outputs ER00 to ER31 of the pulse selector 3, only the output ER18 of the EXOR circuit that has received the delayed pulses P17 and P18 becomes zero. The output ER18 is an 18th pulse selector output with the output ER00 being a 0th output. Consequently, the encoder 4 provides a binary digital signal having five digits of 10010 indicating the 18th pulse.

In this way, the delayed pulse generating ring circuit 1, pulse selector 3, and encoder 4 provide a binary digital signal of five digits (00000 to 11111) that specify a position of the first pulse PA in the delayed pulse generating ring circuit at the time when the second pulse PB is input.

In FIG. 2B counters 21 and 22 count the number of rounds of circulation of the first pulse PA in the delayed pulse generating ring circuit 1, and provide a binary digital signal indicating the counted value.

The first counter 21 has a clock input 211 that is connected to an output point 103 of the delayed pulse P15 in the delayed pulse generating ring circuit 1. The second counter 22 has a clock input 221 that is connected to an output point 104 of the delayed pulse P31. The first and second counters 21 and 22 count how many times the first pulse PA has passed through the output points 103 and 104.

At the output points 103 and 104, rises and falls of the first pulse PA alternately appear whenever the first pulse PA passes through the output points 103 and 104. The first and second counters 21 and 22 count the rises of the pulse. The first and second counters 21 and 22 have, therefore, pulse rise generating circuits 23 and 24, respectively, for converting a pulse fall signal into a pulse rise signal. With this arrangement, either a rise or a fall of the first pulse PA at the output points 103 and 104 can be counted by the first and second counters 21 and 22.

D-type flip-flops 25 and 26 receive outputs C11 to C14 of the first counter 21 and outputs C21 to C24 of the second counter 22 respectively, as well as the second pulse PB.

A multiplexer 27 provides outputs D11 to D14 of the first counter 21 side when a most significant bit (MSB) EC5 of the output of the encoder 4 is zero, and D21 to D24 of the second counter 22 side when the MSB EC5 is one. Namely, if the second pulse PB occurs when the first pulse PA triggers one of the delayed pulses P00 to P15 in the delayed pulse generating ring circuit 1, a corresponding one of the outputs ER00 to ER15 of the pulse selector 3 is zeroed. In this case, the output of the encoder 4 will be smaller than 15, i.e., smaller than 01111 as binary representation. This means that the MSB EC5 of the output of the encoder 4 is zero. As a result, an output of the counter 21 for counting the number of rounds of circulation of the first pulse PA passing through the output point 103 of the delayed pulse generating ring circuit 1 is provided as output bits C01 to C04 of the multiplexer 27.

On the other hand, if the second pulse PB occurs when the first pulse PA causes one of the delayed pulses P16 to P31, the MSB EC5 of the output of the encoder 4 becomes one, so that an output of the second counter 22 for counting the number of rounds of circulation of the first pulse PA passing through the output points 104 of the delayed pulse generating ring circuit 1 is provided as output bits C01 to C04 of the multiplexer 27.

In this way, the number of rounds of circulation of the first pulse PA is completely counted when the second pulse PB occurs, and an output of any one of the counters is correctly grasped.

For example, in FIG. 3, when the second pulse PB rises at time t3, the multiplexer 27 provides the output bits C21 to C24 of the second counter 22 that has not started counting a new round of circulation of the first pulse PA, instead of the output bits C11 to C14 of the counter 21 that has started counting a new round of circulation of the first pulse PA after the first pulse PA caused the delayed pulse P15. When the second pulse PB rises at time t5, the first pulse PA is in the next circulation in the delayed pulse generating ring circuit 1, so that the multiplexer 27 provides the output bits C11 to C14 of the first counter 21 that has already counted the number of rounds of circulation of the first pulse PA.

FIG. 2B a D-type flip-flop 11 receives the output bits EC1 to EC5 of the encoder 4 as first to fifth bits, and the output bits C01 to C04 of the multiplexer 27 as sixth to ninth bits. The D-type flip-flop 11 combines the two inputs and provides a binary digital signal having bits D0 to D8 as an output of the pulse phase difference encoding circuit in response to a clock signal DCK.

In this way, a phase difference between the first and second pulses PA and PB is detected based on the 32 delayed pulses produced in the delayed pulse generating ring circuit 1, and represented by an encoder output, i.e., a digital signal of five bits. Added to this encoder output are upper four bits provided by the counter that has counted the number of rounds of circulation of the first pulse PA in the delayed pulse generating ring circuit 1.

In FIG. 2B, the clock input DCK is supplied to the D-type flip-flop 11 that is the last stage of the pulse phase difference encoding circuit. To stabilize data to be supplied to the D-type flip-flop 11, a sufficient time is interposed after the second pulse PB occurs until the clock input DCK is supplied to the D-type flip-flop 11.

In FIG. 2B, a reset pulse RGCR resets (zeroes) the first and second counters 21 and 22 after outputs of the counters 21 and 22 are latched in response to the second pulse PB and before the next first pulse PA occurs.

In the above embodiment, the two output points 104 and 105 of the delayed pulse generating ring circuit 1 provide count pulses for counting the number of rounds of circulation of the first pulse PA. According to the present invention, it is possible to arrange, if required, more than two output points to provide count pulses. In this case, the number of counters must be increased accordingly.

In the embodiment of FIGS. 2A and 2B, the outputs of the delayed pulse generating ring circuit 1 and counters are continuously coupled together. To achieve this, the number of output lines of the delayed pulse generating ring circuit 1 must be $2^n$. On the other hand, to sequentially alter delayed pulses generated in the delayed pulse generating ring circuit 1 round by round, the number of inverters 101 forming one round of the delayed pulse generating ring circuit 1 must be odd. Due to this, a delay time between certain two adjacent delayed pulses must be produced by two inverters. This is the reason why the inverter 1011 and NAND circuit 102 are interposed between the delayed pulses P31 and P00 to produce the delay time of two stages.

If the operation speed of each inverter has a sufficient margin, the operation speed of each inverter may be set such that a delay time for the section of the two-inverter stage is equal to a delay time of a single inverter stage. This arrangement prevents detection accuracy from deteriorating. In this case, a detecting resolution to be realized without deteriorating the detection accuracy is determined by the delay time of the two inverters.

Figure 4:
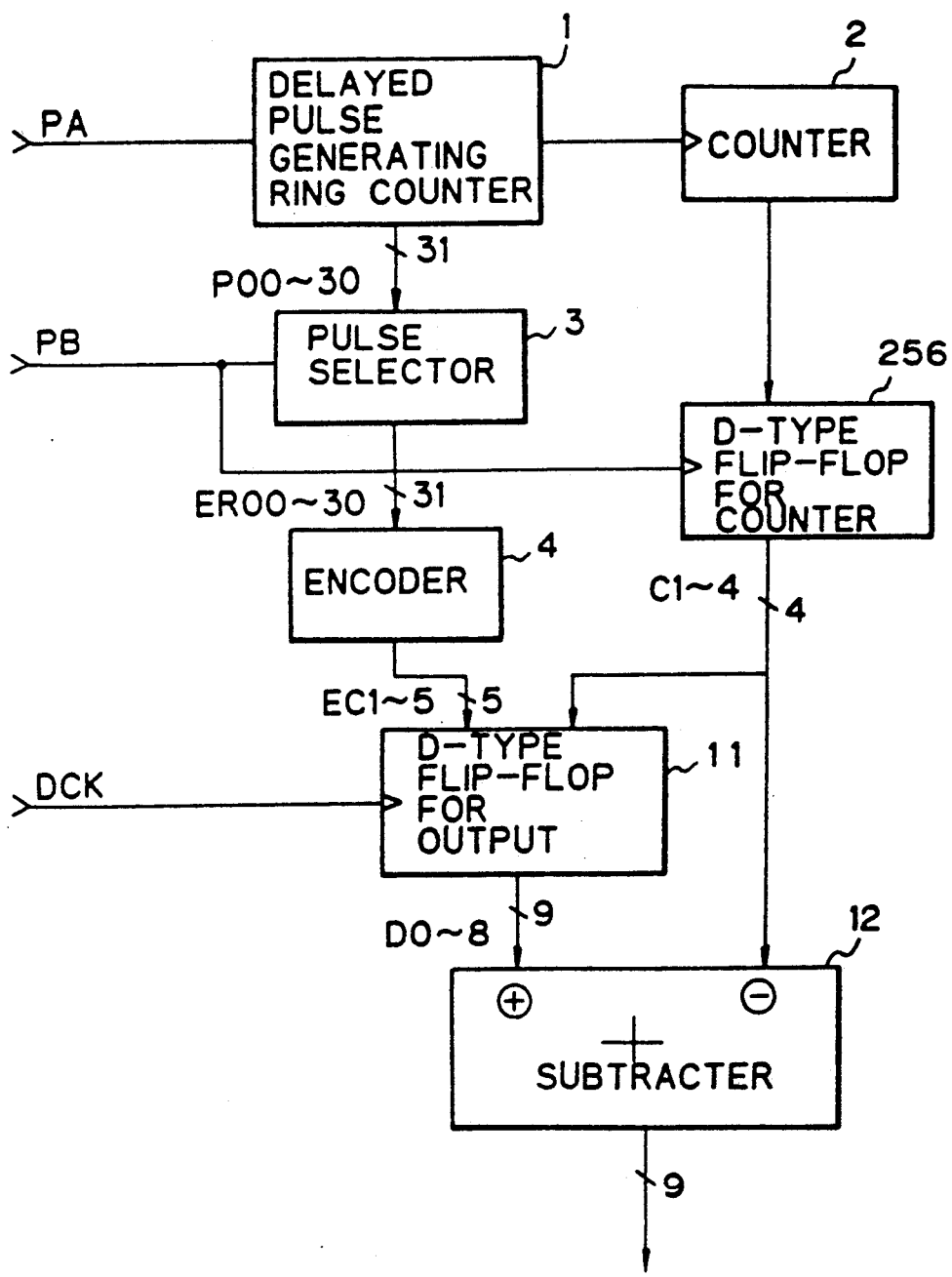
FIG. 4 is a block diagram showing a second embodiment of the present invention.

To solve this problem, the present invention provides another embodiment shown in FIG. 4. The resolution of a pulse phase difference encoding circuit of this embodiment is determined by the delay time of a single inverter.

The pulse phase difference encoding circuit of FIG. 4 provides a binary digital signal of nine bits indicating a phase difference between a first pulse PA and a second pulse PB. Similar to the first embodiment of FIG. 2, the circuit of FIG. 4 comprises a delayed pulse generating ring circuit 1, a pulse selector 3, an encoder 4, and a counter 2. An output of the encoder 4 provides a lower five bits of the binary digital signal of nine bits, while an output of the counter 2 provides an upper four bits of the binary digital signal.

In FIG. 4, a D-type flip-flop 256 reads an output of the counter 2, and a D-type flip-flop 11 reads output bits EC1 to EC5 from the encoder 4 as well as output bits C1 to C4 from the D-type flip-flop 256. The first pulse PA, second pulse PB, and clock input DCK are the same as those of the first embodiment of FIG. 2.

The embodiment of FIG. 4 differs from the first embodiment of FIG. 2 in that the number of output lines for delayed pulses P00 to P30 of the delayed pulse generating ring circuit 1 is only 31. The number of the delayed pulses P00 to P30 is odd, namely the number of inverters connected in a ring shape is odd. It is not necessary, therefore, to arrange two inverters for a delay time between certain two adjacent delayed pulses. Namely, detection resolution of this embodiment is determined by a delay time of a single inverter without deteriorating the phase difference detection accuracy. Since the number of the output lines of the delayed pulse generating ring circuit 1 is not $2^n$, some operation is needed to continuously couple the outputs of the delayed pulse generating ring circuit 1 and counter 2 together in providing a digital signal.

Referring again to FIG. 2A, the output bits EC1 to EC5 from the encoder 4 form the bits D0 to D4 of an output of the D-type flip-flop 11, and the output bits CO1 to CO4 from the multiplexer 27 form the bits D5 to D8 of the output of the D-type flip-flop 11. Supposing the output bits EC1 to EC5 express a decimal number n (integer of 0 to 31) and the output bits CO1 to CO4 represent a decimal number N (integer of 0 to 15), the output bits D0 to D8 from the D-type flip-flop 11 express a decimal number of n+32N.

On the other hand, the embodiment of FIG. 4 has the 31 output lines for delayed pulses P00 to P30 from the ring delay pulse generating circuit 1 to express a decimal number n, i.e., a integer positive of 0 to 30. This means that an output of the D-type flip-flop 11 must be n+31N with the N being an output from the counter 2 side. However, if the D-type flip-flop 11 reads the output bits EC1 to EC5 as a lower five bits and the output bits C1 to C4 as an upper four bits, the output bits D0 to D8 of the D-type flip-flop 11 of FIG. 4 represent a decimal number of n+32N. To solve this problem, a subtracter 12 is arranged to subtract N from the output bits D0 to D8 of the D-type flip-flop 11, thereby providing a correct output of n+31N.

With the above arrangement, resolution can be improved without deteriorating detection accuracy.

If the pulse selector 3 of FIG. 4 is the same as the pulse selector 3 of FIG. 2, the embodiment of FIG. 4 can omit the inverter 105 of FIG. 2 for preventing the output ER00 from being zeroed not only when the first pulse PA reaches the output line for delayed pulse P30 but also on other occasions, because the number of the output lines for delayed pulses P00 to P30 of the delayed pulse generating ring circuit 1 of FIG. 4 is odd.

With the above arrangement, a delay time of one delay stage of the delayed pulse generating ring circuit is equal to a delay time of a single inverter. In this case, resolution of phase difference detection can be improved by increasing the operational speed of each inverter. For example, instead of usual silicon CMOS inverters, inverters made of high-speed compound semiconductor transistors may be used to form a delayed pulse generating ring circuit to further improve the resolution of phase difference detection. Since operation speeds of circuits other than the delayed pulse generating ring circuit do not influence the detection resolution, wafer integration, selective epitaxial growing, etc., may be employed to form high-speed devices only for the delayed pulse generating ring circuit on a silicon IC chip, thereby reducing cost.

The above arrangements realize a pulse phase difference encoding circuit having an excellent resolution, and are applicable for the following apparatuses and systems.

A first application is a system for finding a distance to an object. The system emits a laser beam, detects a reflected wave from the object, and detects a phase difference between a pulse generated at the time the beam is emitted and a pulse generated at the time the reflected wave is detected, thereby finding the distance. This system can employ the above-mentioned pulse phase difference encoding circuit of the present invention to measure the distance at high resolution. For example, if a phase difference of pulses can be detected at a resolution of 1 ns, a distance can be measured at a resolution of 15 cm.

A measuring circuit employing the pulse phase difference encoding circuit of the present invention will be explained next.

Figure 5:
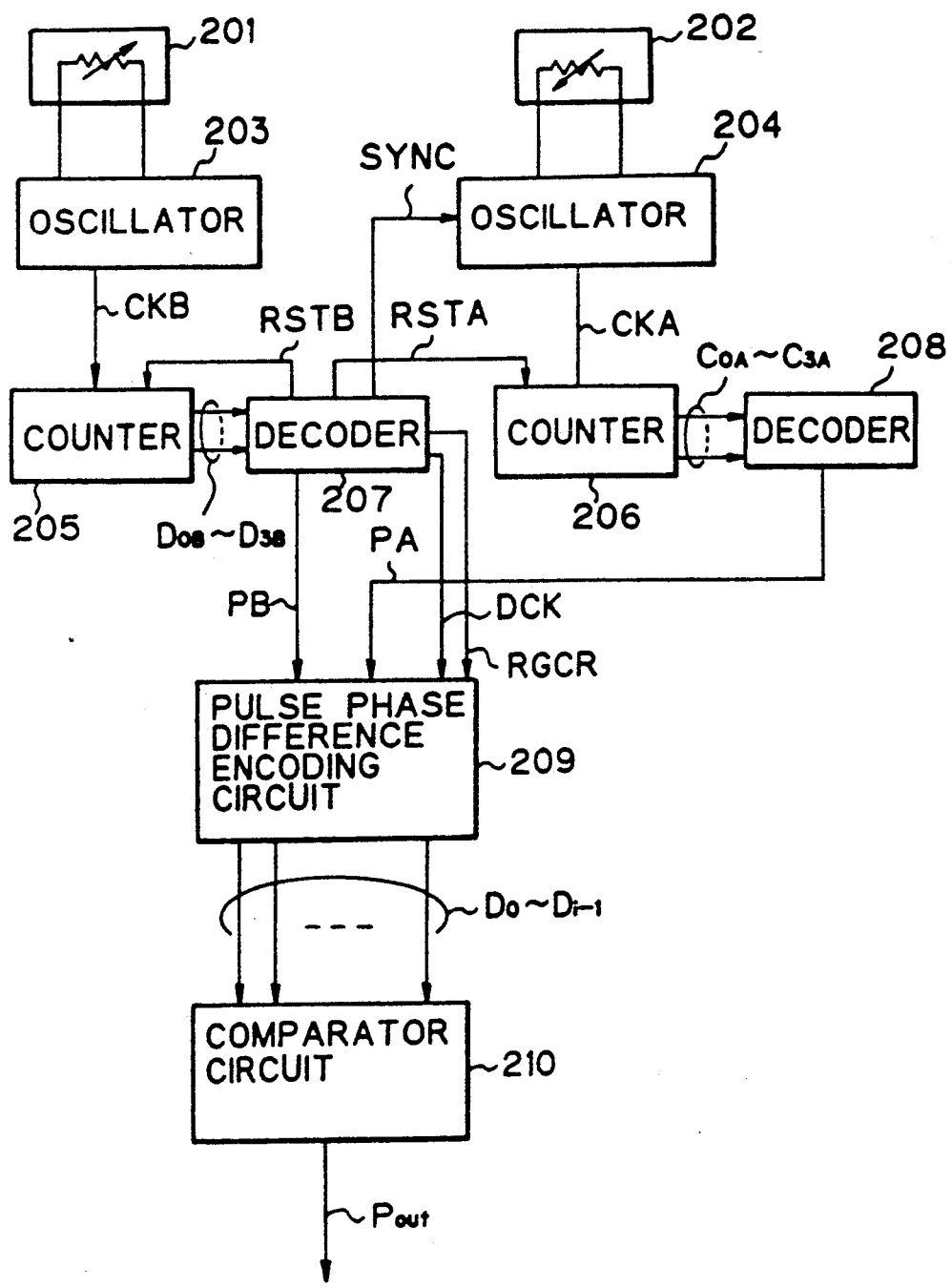
FIG. 5 is a block diagram showing a circuit for measuring a physical quantity in response to resistance values, according to the embodiment of the present invention.

FIG. 5 is a block diagram showing a resistance change detecting circuit employing the pulse phase difference encoding circuit. In the figure, numerals 201 and 202 are resistance elements whose resistances change. The resistance elements may be magnetic resistance elements (MREs) for forming a sensor circuit for detecting magnetism. The magnetic resistance elements may be strain gauge resistance wires of a sensor circuit for detecting pressure. Various resistance elements are employable to realize sensor circuits in which resistance values change in response to certain physical quantities.

The circuit of FIG. 5 detects a change in a difference between resistance values of the resistance elements 201 and 202. When the difference of the resistance values of the two resistance elements changes in response to a change in a certain physical quantity, the circuit can detect the change in the physical quantity. When the resistance values of the two resistance elements change opposite to each other, a maximum sensitivity is obtainable.

Numerals 203 and 204 are oscillators whose oscillation frequencies change in response to changes in the resistance values of the resistance elements 201 and 202 respectively. The oscillators 203 and 204 have waveform shaping circuits and provides pulse signals CKB and CKA shown in FIG. 6 whose frequencies are determined by the resistance values of the resistance elements 201 and 202.

Figure 6:
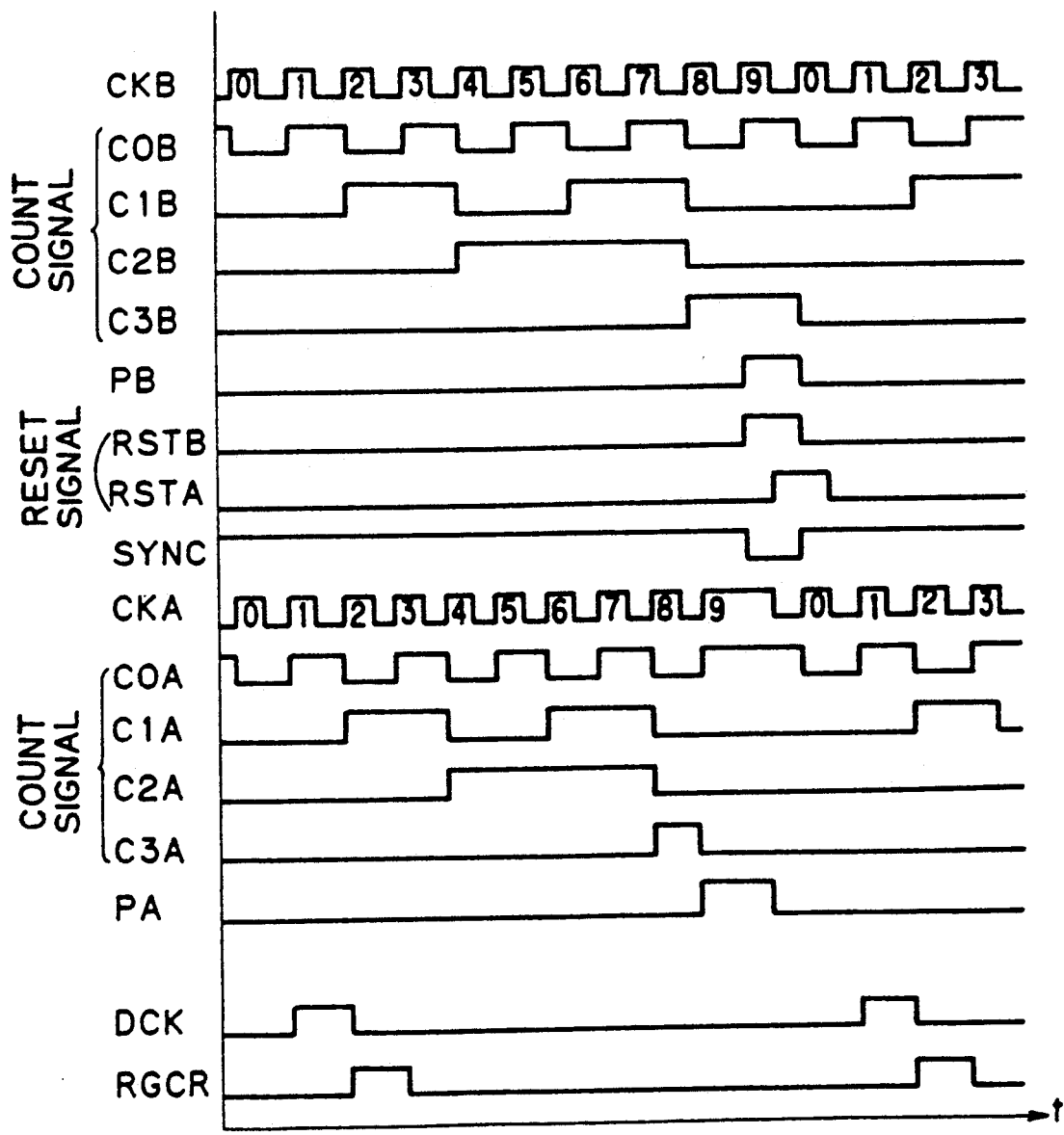
FIG. 6 is a view showing waveforms appearing at various parts of the circuit of FIG. 5.

Numerals 205 and 206 are known counters for counting the pulse signals CKB and CKA provided by the oscillators 203 and 204 and providing count signals C0B to C3B and C0A to C3A as shown in FIGS. 5 and 6.

Numerals 207 and 208 are decoders. When the counter 205 reaches a predetermined count value (nine in this embodiment), the decoder 207 provides reset signals RSTB and RSTA shown in FIG. 6 to the counters 205 and 206 respectively. At the same time, to synchronize the start of the next counting of the counters 205 and 206, the decoder 207 provides the oscillator 204 with a synchronizing signal SYNC. When the counter 205 reaches a count of nine, the decoder 207 provides a frequency dividing pulse signal PB as shown in FIG. 6.

Similar to the decoder 207, the decoder 208 provides a frequency dividing pulse signal PA when a count of the counter 206 reaches nine. Namely, when the counters 205 and 206 count the same number (nine in FIG. 6) of pulse signals CKB and CKA, the decoders 207 and 208 provide the frequency dividing pulse signals PB and PA, so that a difference between rise times of the frequency dividing pulse signals PB and PA may correspond to a time that represents cumulative phase differences between the respective pulse signals. This arrangement has an improved detection sensitivity with respect to a change in a certain physical quantity, and can detect a slight change in an oscillation frequency due to a change in the physical quantity. The pulses PA and PB of this example correspond to the first and second pulses PA and PB of the first embodiment.

Numeral 209 is a pulse phase difference encoding circuit according to any one of the embodiments of the present invention. The pulse phase difference encoding circuit 209 provides a binary signal having "i" bits D0 to Di−1 (i being a positive integer) indicating a phase difference between the pulse signals PA and PB. The pulse signal PB is delayed behind the pulse signal PA by a certain delay time.

Numeral 210 is a comparator circuit for comparing a difference between previous binary digital data provided by the pulse phase difference encoding circuit 209 and present binary digital data provided by the same, and providing a pulse signal Pout. The pulse signal Pout is inverted respectively between 1 and 0 at a maximal value and a minimal value of the difference.

Figure 7:
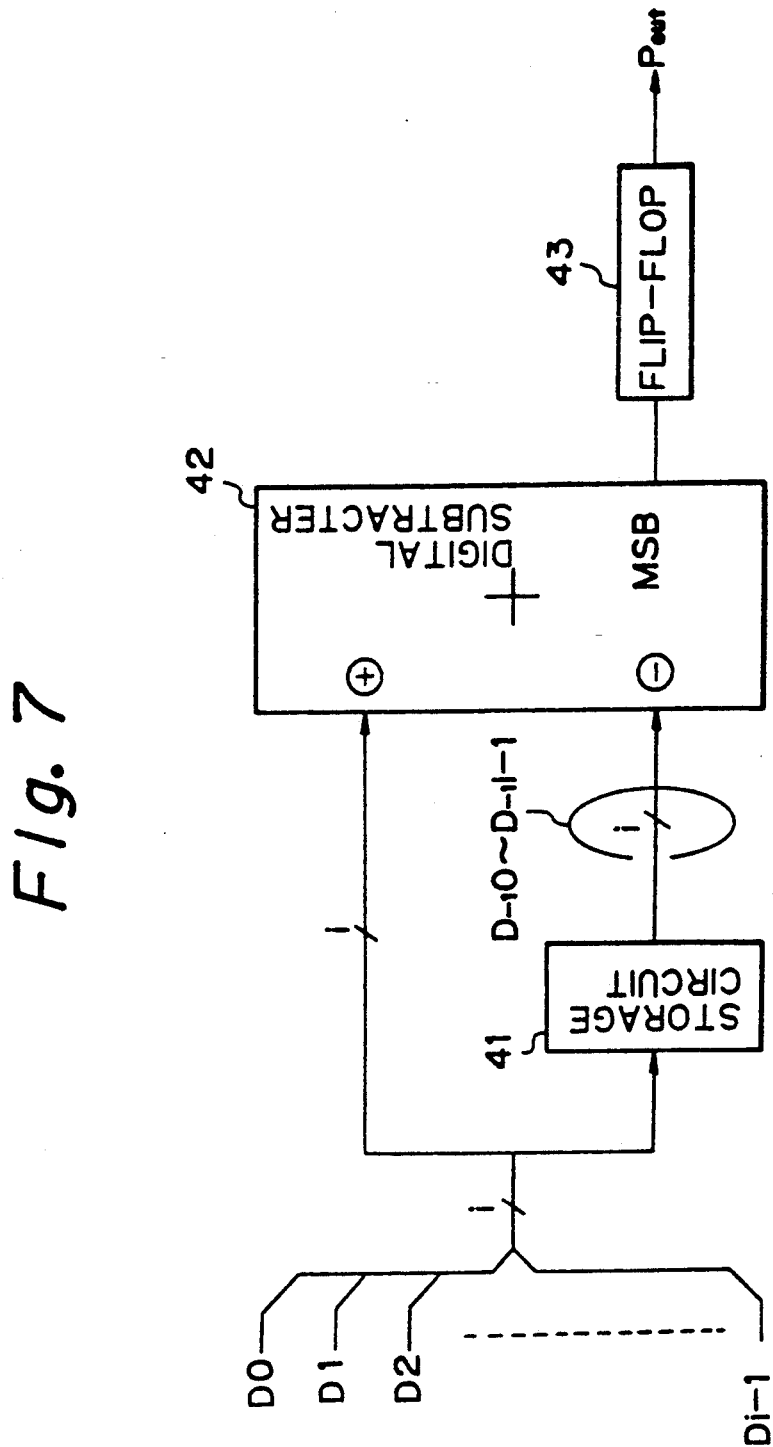
FIG. 7 is a circuit diagram showing the details of a comparator circuit of FIG. 5.

FIG. 7 shows the details of the comparator circuit 210. The comparator circuit 210 has a storage circuit 41 for storing previous binary digital data D-10 to D-1i−1 (present binary digital data being D0 to Di−1) provided by the pulse phase difference encoding circuit 209. The comparator circuit 210 further has a digital subtractor 42 for calculating a difference between the previous binary digital data D-10 to D1i−1 stored in the storage circuit 41 and the present binary digital data D0 to Di−1. The comparator circuit 210 further has a flip-flop 43 for receiving a bit signal indicating whether a result of the operation in the digital subtracter 42 is positive or negative, and providing the pulse signal Pout.

When the binary digital data D0 to Di−1 indicating the phase difference of the two frequency dividing pulse signals PA and PB change from increasing to decreasing or from decreasing to increasing, the pulse signal Pout changes from 1 to 0 or from 0 to 1.

In the above circuit for detecting a change in a difference in resistance values of a pair of resistance elements in response to a certain physical quantity, the resistance elements should have the same temperature coefficient to omit a special temperature compensating circuit. Since the circuits for handling frequencies that have been produced in response to changes in resistance values of the resistance elements are all digital circuits, the circuit of FIG. 5 is advantageous in operating under a high temperature.

The pulse phase difference encoding circuit encodes a phase difference between two pulses representing the difference between the resistance values of the two resistance elements into binary digital data signals, and the encoded signals are compared with each other for every sampling to detect a change in the phase difference between the pulses. Even when the resistance values of the pair of resistance elements fluctuate so that a center value of the changes in the phase difference of the two pulses fluctuates, the phase difference can correctly be detected. Accordingly, it is not necessary to precisely align the resistance values of the two resistance elements.

Although the detection circuit of FIG. 5 employs resistance elements, alternatively, it is possible to employ detection elements whose electrostatic capacitances change in response to a change in a certain physical quantity to easily convert changes in the electrostatic capacitances into changes in frequencies with use of known RC oscillators. In this way, the circuit of the persent invention is applicable in various ways.

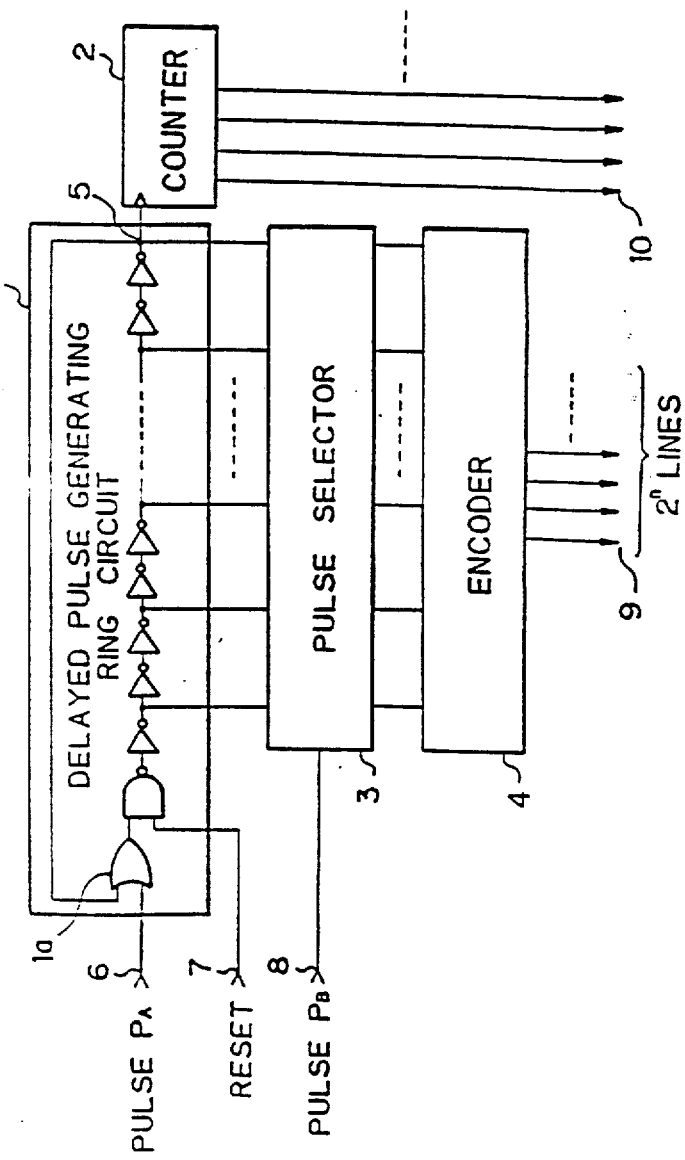

We claim:

1. A phase difference detecting circuit for detecting a phase difference between a first signal and a second signal delayed from said first signal by a certain delay time, said circuit comprising:
- a delayed signal generating means comprising a plurality of serially-connected delay elements having an end delay element connected to a beginning delay element to form a ring circuit, said first signal being input to any one connecting portion formed between any two adjacent delay elements, for sequentially generating a delayed signal at each connecting portion of each said delay element, said signal being sequentially delayed from one connecting portion to another;
- position detecting means, connected to said delayed signal generating means, for detecting a position of said delayed signal from one of a plurality of said delay elements at a time when the second signal is input thereto;
- counting means, connected to said delayed signal generating means, for counting a number of times that said delayed signal travels between said end and beginning delay elements; and
- detecting means, connected to said position detecting means and to said counting means, for detecting a phase difference between said first and second signals using a count from said counting means and a detected position of said delayed signal detected by said position detecting means.

2. A phase difference detecting circuit according to claim 1, wherein said first and second signals are pulse signals.

3. A time difference detecting means for providing a signal indicating a time difference between a first signal and a second signal, comprising:
- a delayed pulse generating means having a plurality of delay elements connected in series to form a series circuit, receiving said first signal, for generating a plurality of delayed pulses while said first signal is passing through the delay elements;
- a detecting means, connected to said delayed pulse generating means and receiving said delayed pulses, for detecting a latest one of said delayed pulses when receiving said second signal a certain time after said first signal and generating a detecting signal indicating a time period elapsed between the time when said first signal is input thereto and the time when said second signal is input thereto;
- means, connected to said delayed pulse generating means, for connecting one end of the series circuit to an other end thereof to repeatedly circulate said delayed pulses from the one end toward the other end through the delay elements of the series circuit;
- counting means, connected to said delayed pulse generating means, for counting a number of times that the delayed pulses circulate in the series circuit; and
- means, connected to said detecting means and to said counting means, for combining the detecting signal from the detecting means with the number of times of circulation counted by the counting means, to indicate a time difference between the first and second signals.

4. A time difference detecting means according to claim 3, wherein said counting means comprises a first counter and a second counter, and said first counter connected to a first output point in said delay pulse generating means for receiving a count signal whenever said first signal passes through the first output point, counting the first number of rounds of circulation of said first signal, and providing a result of the counting;
- said second counter connected to a second output point located in said delay pulse generating means for receiving a count signal whenever said first signal passes through the second output point, counting the number of rounds of circulation of said first signal, and providing a result of the counting; and
- wherein, when both of the counted numbers of said two counters are identical, either one of said counted numbers is output while when the counted numbers of both counters are different from each other, the one of said counted numbers having a smaller number than that of the other is output.

5. A time difference detecting means according to claim 3, wherein said counter outputs its counted number when said second signal is input thereto.

6. A time difference detecting means according to claim 3, wherein the number of said delay pulse generating means comprises an odd number of delay elements.

7. A time difference detecting means according to claim 3, wherein the number of said delay elements of said delay pulse generating means is other than $2^n$ (n being a positive integer), and the detecting signal whose upper bits are formed from an output of the counting means and whose lower bits are formed from an output of the detecting means is processed through a predetermined operation, thereby providing a continuous digital signal indicating a time difference between the first and second signals.

8. A phase difference detecting circuit for detecting a phase difference between a first signal and a second signal subsequent to said first signal, said circuit comprising:
- a series circuit including a plurality of serially-connected delay elements having an end delay element connected to a beginning delay element to form a ring circuit, said first signal being input to any one connecting portion formed between any two delay elements, a delayed signal being produced at each said connecting portion of each said delay element which is sequentially delayed from one connecting portion to another;
- an encoder, connected to said series circuit and to receive said second signal to detect a position of said delayed signal from one of a plurality of said delay elements, at a time when the second signal is input thereto;
- a counter circuit, connected to said series circuit to count a number of times that said delayed signal travels between said end and beginning delay elements; and
- detecting means for detecting a phase difference between said first and second signals using a count from said counter circuit and a detected position of said delayed signal detected by said encoder.

9. A phase difference detecting circuit according to claim 8, wherein said first and second signals are pulse signals.

10. A time difference detector for providing a signal indicating a time difference between a first signal and a second signal, comprising:
- a plurality of delay elements connected in series to form a series circuit, receiving said first signal, and generating a plurality of delayed pulses while said first signal is passing through the delay elements;

an encoder circuit connected to said series circuit to receive said delayed pulses, configured to detect a latest one of said delayed pulses when receiving said second signal a certain time after said first signal, and generating a detecting signal indicating a time between an input of said first signal and an input of said second signal;

a connecting element connected between one end of the series circuit and an other end thereof, to repeatedly circulate said delayed pulses from the one end toward the other end through the delay elements of the series circuit;

a counter circuit connected to count a number of times that the delayed pulses circulate in the connecting element of the series circuit; and means for combining the detecting signal from the encoder with the number of times of circulation counted by the counter, to indicate a time difference between the first and second signals.

11. A time difference detector according to claim 10, wherein said counter circuit comprises a first counter and a second counter, and said first counter connected to a first output point in said series circuit for receiving a count signal whenever said first signal passes through the first output point, counting the first number of rounds of circulation of said first signal, and providing a result of the counting;

said second counter connected to a second output point located in said series circuit for receiving a count signal whenever said first signal passes through the second output point, counting the number of rounds of circulation of said first signal, and providing a result of the counting; and wherein, when both of the counted numbers of said two counters are identical, either one of said counted numbers is output while when the counted numbers of both counters are different from each other, the one of said counted numbers having a smaller number than that of the other is output.

12. A time difference detector according to claim 10, wherein said counter outputs its counted number when said second signal is input thereto.

13. A time difference detector according to claim 10, wherein there are an odd number of delay elements.

14. A time difference detector according to claim 10, wherein the number of said delay elements of said series circuit is other than $2^n$ (n being a positive integer), and the detecting signal whose upper bits are formed from an output of the counter and whose lower bits are formed from an output of the encoder is processed through a predetermined operation, thereby providing a continuous digital signal indicating a time difference between the first and second signals.

* * * * *

UNITED STATES PATENT AND TRADEMARK OFFICE
CERTIFICATE OF CORRECTION

PATENT NO. : 5,289,135
DATED : February 22, 1994
INVENTOR(S) : Hoshino et al

It is certified that error appears in the above-indentified patent and that said Letters Patent is hereby corrected as shown below:

IN THE DRAWINGS

Replace issued Figure 1 with attached Figure 1 which corrects the spelling of "COUNTER" in box 2 and corrects the legend for line 7.

Signed and Sealed this

Sixth Day of June, 1995

Attest:

BRUCE LEHMAN

Attesting Officer

Commissioner of Patents and Trademarks